United States Patent [19]

Seidler

[11] Patent Number: 4,592,617
[45] Date of Patent: Jun. 3, 1986

[54] SOLDER-BEARING TERMINAL

[75] Inventor: Jack Seidler, Flushing, N.Y.

[73] Assignee: North American Specialties Corporation, Flushing, N.Y.

[21] Appl. No.: 698,618

[22] Filed: Feb. 6, 1985

[51] Int. Cl.$^4$ ............................................. H01R 4/02
[52] U.S. Cl. .............................. 339/275 B; 339/17 C; 339/275 T
[58] Field of Search .............. 339/17 C, 275 B, 275 T

[56] References Cited

U.S. PATENT DOCUMENTS

| | | | |
|---|---|---|---|
| 3,750,252 | 8/1973 | Landman | 339/275 B X |
| 4,019,803 | 4/1977 | Schell | 339/275 B |
| 4,203,648 | 5/1980 | Seidler | 339/275 B X |
| 4,433,892 | 2/1984 | Seidler | 339/275 T X |
| 4,482,197 | 11/1984 | Ouellette et al. | 339/275 B X |

Primary Examiner—Eugene F. Desmond
Attorney, Agent, or Firm—Darby & Darby

[57] ABSTRACT

A solderable lead is provided for connecting an electrically conductive element (such as a terminal clip, or a connector contact, or a semiconductor chip holder terminal) to a metallic area on a substrate or the like, the solderable lead having a discrete slug of solder mechanically engaged in a special way in a position to be melted for bonding the lead to the metallic area. In one form of solderable lead, a terminal clip portion adapted to be secured to a metallic area on a second substrate is also provided, the terminal clip portion having one or two additional discrete masses of solder mechanically engaged with the clip portion in position to be melted for bonding the clip to one or two metallic areas on the second substrate.

18 Claims, 21 Drawing Figures

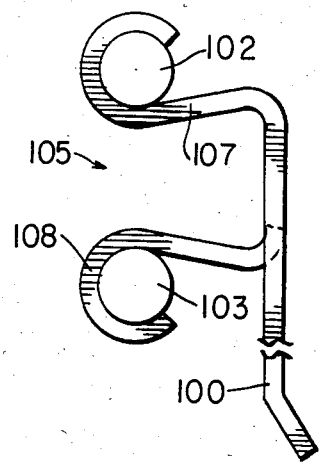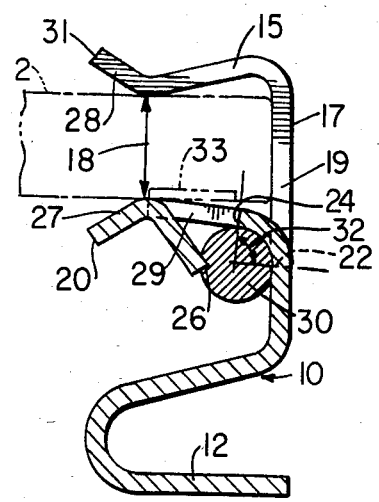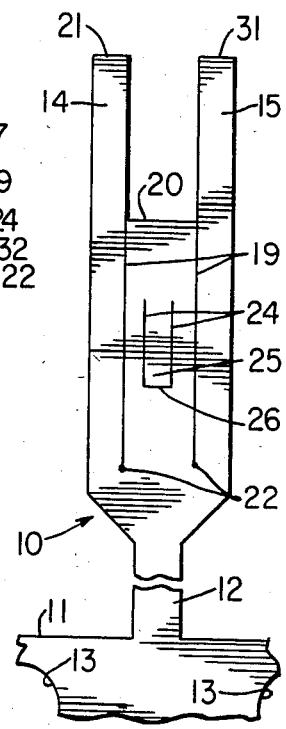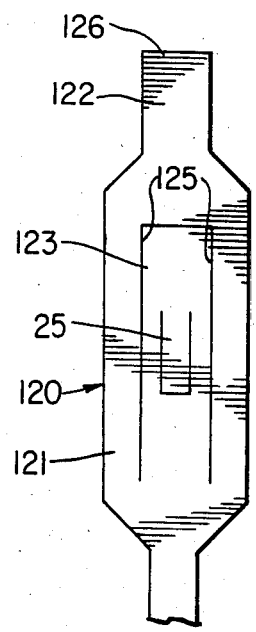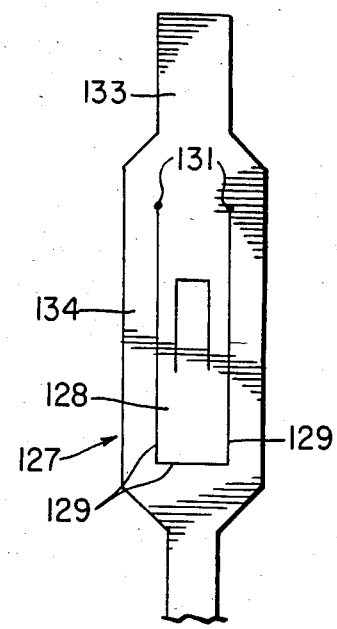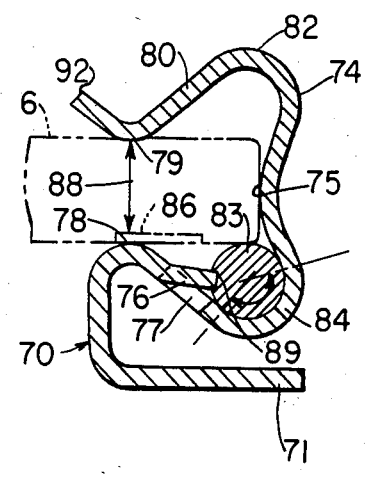

4,592,617

SOLDER-BEARING TERMINAL

BACKGROUND OF THE INVENTION

1. FIELD OF THE INVENTION

This invention relates to a solder-bearing lead or terminal (which may be in the form of a clip) for attachment to a metal surface such as a contact pad on a substrate or the contact or terminal of a chip carrier or connector or the like, with at least one solder slug mechanically engaged with the terminal or lead in position to be melted for soldering it to the metal surface.

2. DESCRIPTION OF THE PRIOR ART

Various means have been provided for associating a quantity of solder with a terminal clip so that when the terminal clip has been positioned on a metal surface (for example, a contact pad on a substrate introduced into the jaws of a terminal which is in the form of a clip) and the assembly is heated, the solder melts to cover the adjacent surfaces of the terminal and pad to form, when cool, a soldered joint between the terminal clip and pad. Clips of this general type are shown in Cox et al., U.S. Pat. No. 3,689,684 where the solder is applied by having the pads pre-tinned; in Landman, U.S. Pat. No. 3,750,252 where a continuous solder wire extends along a strip of clips and is held by a bent-back clip arm; in Schell, U.S. Pat. No. 4,019,803 where an individual solder mass is soldered to a clip arm on the side opposite the contact surface with a solder globule extending across one or both edges of the arm to the adjacent contact surface; and in Seidler, U.S. Pat. No. 4,203,648 where the ends of the jaws of the terminal clip are curved arcuately away from the gap between the jaws, and wrap around a short cylindrical mass or slug of solder by more than 180 degrees to grip and hold the solder slug.

OBJECTS OF THE INVENTION

Broadly, it is an object of the present invention to provide improved means for attaching a solder mass securely to a terminal or lead in a purely mechanical manner.

It is a further object of the invention to provide a solder-bearing lead carrying a supply of solder in at least one convenient location for melting to form a bond with a conductive area or element.

It is another object of the invention to provide a solder and lead assembly which can be made by very simple and efficient stamping steps.

It is a still further object of the invention to provide certain improvements in the form, construction and arrangement of parts of a terminal to attain the above and other objects effectively.

The above and other objects of the present invention are realized in illustrative embodiments possessing the features, properties, and the relation of elements exemplified in the articles of manufacture described in the following.

BRIEF DESCRIPTION OF THE DRAWINGS

For a better understanding of the invention, reference should be made to the following description taken together with the accompanying drawings, in which:

FIG. 1 is a side elevation view of a prior art solder-bearing terminal clip;

FIG. 2 is a sectional side elevation view of a solder-bearing terminal clip according to the present invention;

FIG. 2A is a plan view of a flat blank which may be stamped to produce a clip according to FIG. 2;

FIGS. 2B and 2C are plan views of other flat blanks which may be stamped to produce variants of the clip shown in FIG. 2;

FIG. 3 is a sectional side elevation view of another embodiment of a solder-bearing terminal clip according to the present invention;

DESCRIPTION OF THE PREFERRED EMBODIMENTS

Figure 3A:
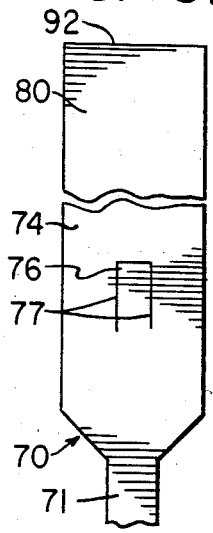
FIG. 3A is a plan view of a flat blank which may be stamped to produce a clip according to FIG. 3.

Referring to FIG. 1, a prior art solderbearing terminal is shown, generally as described in said Seidler Pat. No. 4,203,648. This terminal has a substantially flat body portion 100, a single central spring finger 108 bent outwardly from the body portion 100, and an oppositely disposed additional spring finger 107 constituted by the free (upper) end of the body portion itself, and spaced from finger 108 by a gap 105. The free ends of the fingers 108 and 107 are arcuately curved away from each other (and from the gap 105) and wrap around and grip securely respective cylindrical masses or slugs of solder 102 and 103. As taught by this Seidler patent, each finger wraps around its solder slug by more than 180 degrees to hold it in place. This clip is applied to the edge of a substrate (e.g., a printed circuit board) having two opposed contact pads, so that each of fingers 107 and 108 rests against a respective pad. Heat is then supplied to melt the solder, which flows around the fingers 107 and 108 and bonds the clip securely to the substrate with a good soldered electrical contact.

This prior art terminal clip requires that the solder-holding finger be wrapped around the solder slug by more than 180° to retain the solder. In a progressive multiple-stamping operation, such bends offer production difficulties in requiring a considerable number of stamping stages and special die arrangements to attain such bends. In addition, difficulty may be experienced in properly holding the relatively soft solder slug in place during and after the stamping of the stiffer terminal material.

These disadvantages are avoided and an improved production process and product are attained by the present invention, shown in FIG. 2 and subsequent figures.

FIG. 2A shows a fragment of a terminal strip blank used in one form of the present invention. This strip includes a continuous carrier strip 11 with individual flat terminal blanks 10 connected to it by stems 12 which may also serve as terminal leads. The carrier strip 11 may be provided with pilot holes 13 at regular intervals, as is customary. The terminal blank of FIG. 2A has a body 10 with slits 19 which form a central spring finger 20 and side fingers 14,15, somewhat larger than central finger 20. Central finger 20 in turn has a pair of slits 24 forming a tab 25.

FIG. 2 shows a solder-bearing terminal clip prepared, as by progressive stamping, from the blank shown in FIG. 2A. The clip of FIG. 2 is for attachment to a substrate having contact pads on one side only (i.e., the underside in the drawing). The stem 12 of the clip 10 may be bent into any shape appropriate for a particular application of the present invention and may serve as an electrical lead from the free end of the terminal to other circuit points or components. It is here shown as being bent into a shape suitable for further connection to another substrate or other element.

The clip 10 has a body portion including a flat back portion 17 formed from the lower portions of spring fingers 14 and 15, which are bent to extend laterally from the plane of the back portion 17 of the clip and are spaced apart by the width of the central spring finger 20. Central finger 20 extends laterally in a position spaced from and substantially parallel to the fingers 14 and 15, defining a gap 18 for receiving the edge of a substrate 2. The fingers 14 and 15 are formed from the blank shown in FIG. 2A by the parallel cuts 19 which extend from the free end of spring finger 20 and terminate at end points 22. The free ends 21,31 of fingers 14 and 15 are bent arcuately away from gap 18 to form a tapered entrance 28 for facilitating insertion of the substrate 2 into gap 18. Similarly, the free end of spring finger 20 is bent oppositely to form a second tapered entrance surface 27 for further ease of insertion.

In the finished terminal clip shown in FIG. 2, the tab 25 is bent out of the plane of the central spring finger 20 and away from the substrate receiving gap 18 by a predetermined distance so that a corner 26 of the tab 25 digs into and holds in place a cylindrical mass or slug of solder 30. The corner 26 bites into the softer metal of the solder slug to give an extra strong grip on the slug. The opening 29 remaining in spring finger 20 from where tab 25 was bent out provides additional access for the solder to reach the contact pad 33 on substrate 2. When melted, the solder will flow onto the substrate surface 33 at and near the points of contact between spring finger 20 and the substrate surface 33. This increases the soldered area by including the wall of the slot 29 in finger 20 as well as the substrate and finger surfaces, creating improved electrical conductivity as well as a stronger physical bond.

In the embodiment of the present invention shown in FIG. 2 there is no need for any portion of the clip to extend around and in contact with the solder slug 30 more than 180° degrees, thus simplifying manufacture of the clip. In the embodiment shown, the angle 32 through which the solder slug 30 is in actual contact with the terminal clip may be less than 90 degrees.

FIG. 2B shows a modified form of a flat blank according to the present invention. Instead of the separate spring fingers 14, 15 of FIG. 2A, this flat blank has a single finger 122 forming an extension of the body portion opposing its central spring finger 123. Since the longitudinal slits 125 defining the central spring finger 123 do not extend any nearer to the free end 126 of the body portion 121 than does the central spring finger 123, the single finger 122 may have any particular width desired, up to the width of the body portion 121 itself. The finished terminal will have the shape shown in FIG. 2, but with a single finger 122 instead of the pair of fingers 14,15.

FIG. 2C shows another form of flat blank according to the present invention. This flat blank 127 illustrates that the particular direction in which the central spring finger 128 is oriented may be reversed if desired. The U-shaped slit 129 has its ends 131 directed toward the free end 133 of the clip body portion 134, the end 133 serving in the same manner as finger 122 of FIG. 2B.

Referring to FIGS. 3 and 3A, another modified form of terminal clip is shown. This clip has no central spring finger; the body portion itself is bent to form both jaws of the terminal clip. In this form of clip, the blank includes a stem 71 (corresponding to 12 of FIG. 2), a body portion 74, and a retaining tab 76 formed in the body portion 74 by slits 77 cut as shown in FIG. 3A. The clip body is bent back at a point between the stem 71 and tab 76 to form the contact surface 78 of the clip gap 88 into which a substrate 6 may be inserted. At a location adjacent to and just on the other side of tab 76 from contact surface 78, the body 74 is bent to form a receiving cradle 84 for a solder slug 83. Here again, the retaining tab 76 is bent out of the plane of the body 74 and upwardly so that a corner 89 bites into the softer metal of the solder slug 83 to give a strong grip on the slug as described for the embodiment shown in FIG. 2. Here again, the bend which forms cradle 84 is substantially less than a half-circle. In this position, the solder slug 83, when melted, will flow to points near and between contact pad 86 of the substrate 6 and contact surface 78 of the clip 70. Solder will additionally flow around tab 76 and will form an especially good physical bond between the clip and contact pad 86.

The body portion 74 of the clip, after bowing inwardly toward the edge of substrate 6 for providing a stopping surface 75 against which substrate 6 can be inserted, is bent forwardly at 82 so that the free end 80 of the body portion 74 forms the upper clip jaw. The extreme free end 92 of the upper jaw is bent upwardly away from the gap 88 to form the upper contact surface 79 of the gap 88 for receiving substrate 6. In this arrangement, the spring jaws of the clip provide a strong mechanical grip on substrate 6, while the solder provides a metallic bond and improved electrical conductivity between the clip 70 and contact pad 86. In this modified form of terminal clip, the solder slug 83 is again held by the tab 76 rather than by being wrapped within the clip body, thus providing a more reliable grip on solder slug 83.

Figure 4:
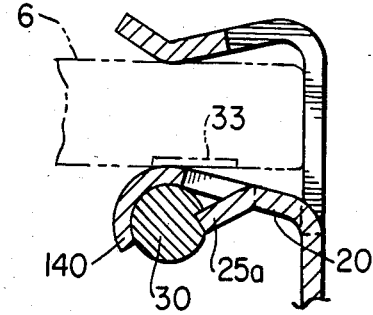
FIGS. 4, 5, 6 and 7 are sectional side elevation views of modified forms of a solder-bearing terminal clip according to the present invention.

FIG. 4 shows a variation of the form of clip of FIGS. 2 and 3. Here, the end of lower finger 20 is curved near its end 140 to form a cradle for solder slug 30, and tab 25a has its free end (which holds the solder) extending in the direction of the end 140.

Figure 5:
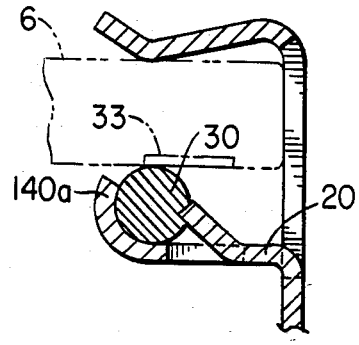

FIG. 5 shows a further variation in which the end 140a of spring finger 20 curves upwardly to form a cradle for solder 30, while tab 25b is bent upwardly to retain the solder.

Figure 6:
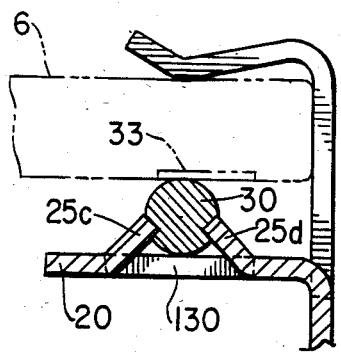

FIG. 6 shows another variation, in which the solder 30 is held by two tabs 25c and 25d against the spring finger 20, and straddles the opening 130 formed by the bending of tabs 25c and 25d.

Figure 7:
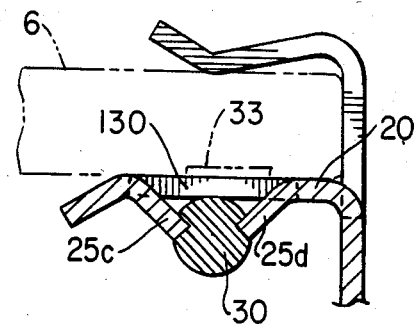

FIG. 7 shows a modified form of clip, like FIG. 6 but with the solder held on the side of finger 20 away from the substrate-receiving gap.

Figure 8:
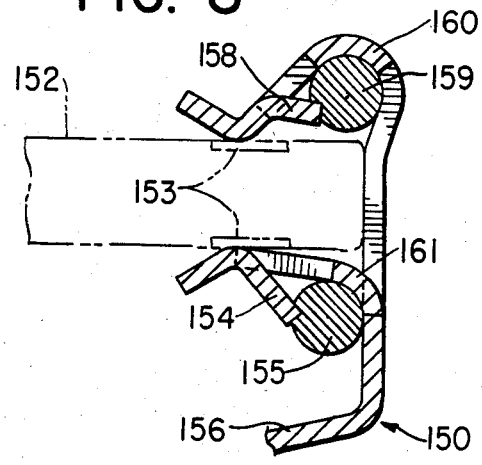
FIG. 8 is a sectional side elevation view of another embodiment of a solder-bearing terminal clip according to the present invention.
Figure 8A:
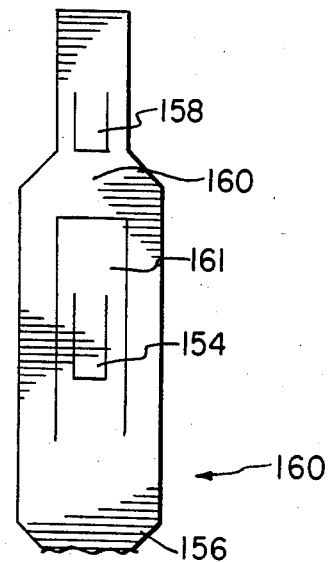
FIG. 8A is a plan view of a blank which may be stamped to produce a clip according to FIG. 8.

FIG. 8 shows another form of terminal clip incorporating the present invention. Clip 150 shown in FIG. 8 may be made from a flat blank 160 of FIG. 8A. The clip 150 is intended for use with a substrate 152 having contact pads 153 on both sides. The central spring finger 161, as seen in FIG. 8A, is identical to the central spring finger 123 of the flat blank 120 of FIG. 2B. Thus, a first solder slug 155 is held by a tab 154 on the side of the central spring finger 161 nearer the stem end 156 of the clip body portion. An additional retaining tab 158, as shown in FIG. 8, however, is similar to the retaining tab 76 of clip 70 shown in FIG. 3, with a solder slug 159 held in a relatively short bend which forms cradle 160. Here again, the solder slugs 155 and 159 are in actual physical contact with the terminal clip body over relatively small angles.

Figure 9:
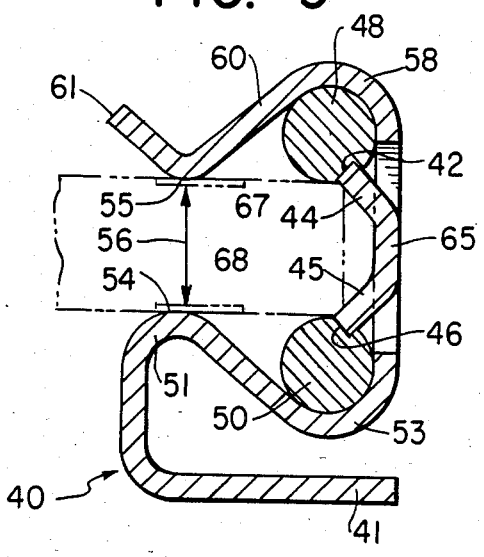
FIG. 9 is a sectional side elevation view of yet another embodiment of a terminal clip according to the present invention.
Figure 9A:
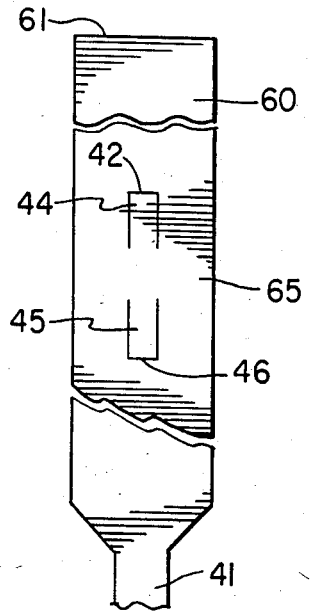
FIG. 9A is a plan view of a flat blank which may be stamped to produce the clip shown in FIG. 9.

Still another modified form of terminal clip is shown in FIGS. 9 and 9A for connection to a substrate with two contact pads 67,68. In this clip, two tabs 44 and 45 are formed so that they extend in opposite directions from each other and are located so as to form the portion of the clip against which the substrate abuts when inserted between the jaws, as seen in FIG. 9. Clip 40 has a stem portion 41 and a bend 51 to form the first contact surface 54 of the gap 56 between the clip jaws. The clip body 65 is then bent upwardly at 53 to form a cradle for a first solder slug 50. In this form of clip, the body portion 65 is then bent forwardly through less than a semicircle to form a second cradle 58 for another solder slug 48. The bend 57 forming the cradle 58 further serves to bend the free end 60 of the body portion forwardly to form the upper jaw of the terminal clip. The tip 61 of the clip is bent upwardly away from the opposed contact surface 54 to form the second contact surface 55 of the clip gap 56. The retaining tabs 44 and 45 are located between cradles 58 and 53. The tabs 44 and 45 are bent out of the plane of the body toward the gap 56 so that their ends 42 and 46 dig into the solder slugs 48 and 50 as described previously. In this form of clip, when the solder slugs melt, solder will flow to points near and between the contact pad 67 and second contact surface 55, as well as near and between contact pad 68 and first contact surface 54, thus providing the desired electrical and physical connection between the contact pads 67,68 of the substrate 4 and the terminal clip 40.

In the forms of the invention described thus far, the stem 12, 41, 71 or 156 has been shown bent to be substantially parallel to the substrate. However, it will be understood that this is not necessary; the stem may extend perpendicularly to the substrate position, or be arranged in other positions as may be desired.

Figure 10A:
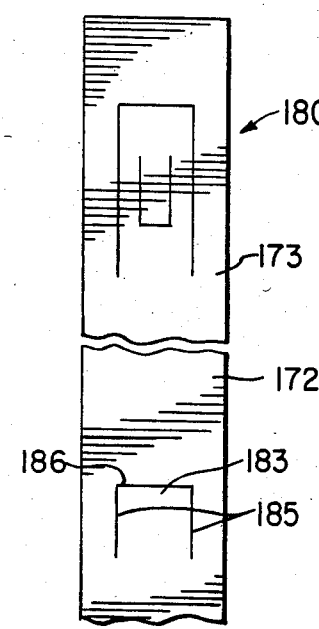
FIG. 10A is a plan view of a flat blank which may be stamped to produce the terminal shown in FIG. 10.
Figure 10:
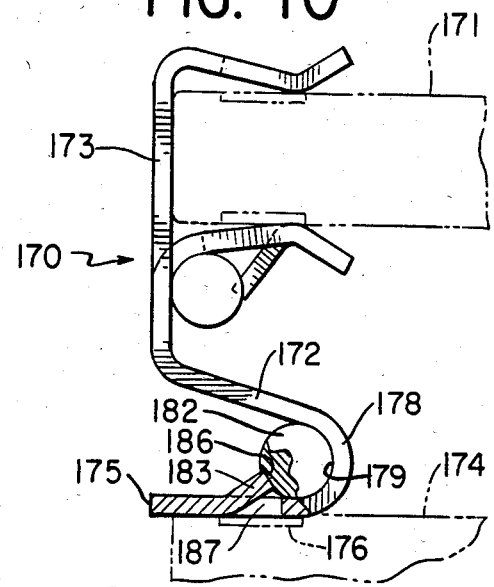
FIG. 10 is a partial sectional side elevation view of the terminal clip of FIG. 2, further modified to include a solderable terminal or lead for mounting the clip on another substrate or conductive element.

FIGS. 10 and 10A show a further modification of the device of FIG. 2, where certain aspects of the invention are applied to the stem portion 172 of the clip 170. The body portion 173 of the clip 170 is illustrated as being the same as in clip 10 of FIG. 2, with an integral stem portion 172. In this form of clip, the stem portion 172 provides a lead for attaching the clip 170, either with or without substrate 171 inserted, to a mounting substrate 174 having a contact pad 176.

Figure 10B:
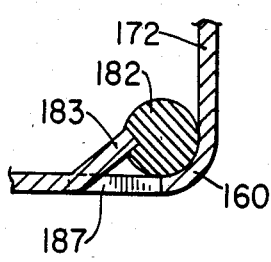
FIG. 10B is a fragmentary view of a modified form of solderable lead according to the present invention.

The stem portion 172 has a flat mounting surface portion 175 bent at 178 out of the plane of the stem portion by less than a semicircle. Two versions are shown in FIGS. 10 and 10B. In FIG. 10, the lead 172 is first bent partially under the clip, and then a return bend forms a cradle 179 for receiving a solder slug 182. The bend for the cradle may thus be somewhat larger than 90° and less than 180°. In the form shown in FIG. 10B, the lead 172 extends directly downward from the clip, and is bent about 90° at 160 to form the solder cradle.

The retaining tab 183 is defined by longitudinal slits 185 as shown in FIG. 10A, which illustrates the flat blank 180 as stamped to produce the clip 170 shown in FIG. 10. The tab 183 is bent upwardly out of the plane of the flat mounting surface 175 in the direction of the cradle 179, and at its end 186 is indented into the solder slug 182, thus providing a strong grip on the slug 182 and ensuring that the slug 182 will remain affixed into the stem cradle 179.

Bending of the tab 183 leaves an opening 187 extending through the flat mounting surface portion 175. In this configuration, the solder slug 182, when melted, will flow into the slot 187 and between the mounting surface portion 175 and the contact pad 176, forming an especially good electrical as well as metallic connection between the clip 170 and the substrate contact pad 176.

According to another aspect of the invention, a solder slug cradle may be formed in the stem or lead portion of any of the terminal clips described above, as well as other terminals. Also, the solder-retaining cradle and tab arrangement of the present invention is not restricted to terminal clips of the type described above, but may be applied to any element which connects an electrically conductive member at one end to a metal contact such as the contact pad on the surface of a substrate. The lead portion of clip 170 shown in FIG. 10 may therefore be integrally connected at its other end to many different devices, including as examples connector pins, female box contacts, female double-beam cantilever contacts, wire-wrap posts, and the like, in addition to the terminal clips described.

Figure 11:
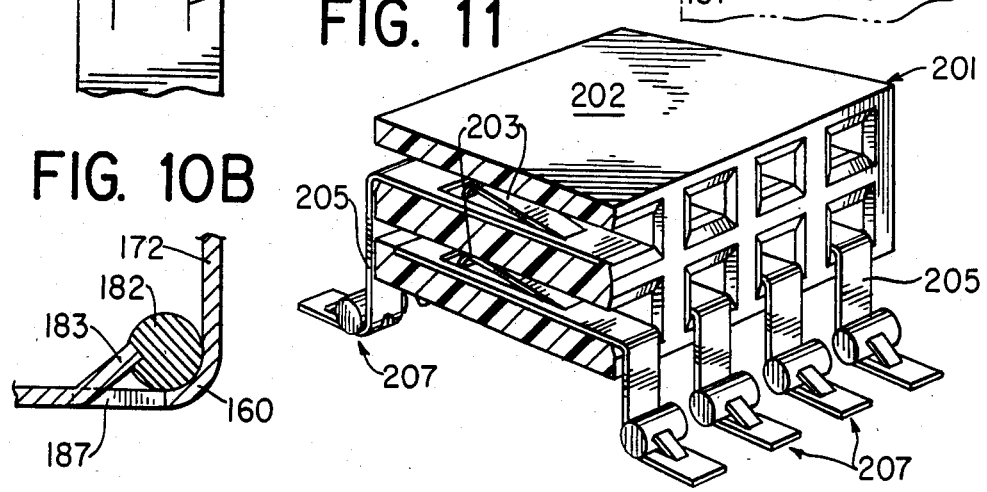
FIG. 11 is a perspective view of a multiple connector having contacts with solderable terminal leads according to the present invention.

Thus, FIG. 11 shows a multiple connector 201 having a housing 202 containing a number of spring contacts 203. These contacts have integral leads 205 extending outwardly from housing 202. The leads 205 terminate in solder-retaining arrangements 207, of any of the forms described above, to facilitate the surface mounting of the connector 201 on a substrate having contact pads in registry with the lead terminations 207. In this way, all leads may be simultaneously soldered to the substrate by properly positioning and then heating.

Figure 12:
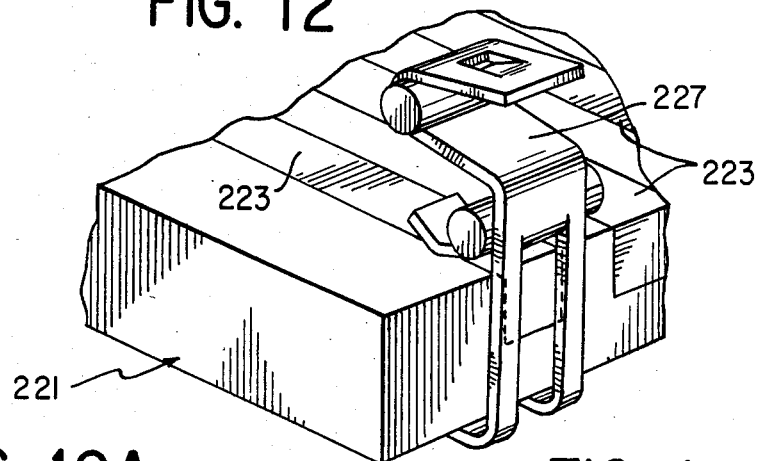
FIG. 12 is a perspective view of a semiconductor chip holder in combination with a solderable terminal clip with a solderable lead according to the present invention.

FIG. 12 shows a semiconductor chip holder 221 having a number of terminal strips 223. A terminal clip 225 of any of the forms described above may be joined to a respective strip 223 by soldering. The lead or stem 227 extending from the clip may then have a solderable termination as described above.

Figure 13:
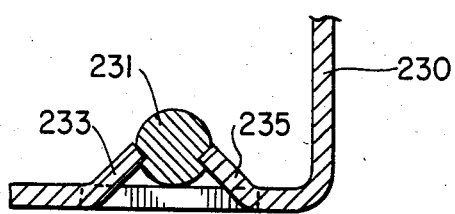
FIG. 13 is a fragmentary view of a modified form of solderable lead according to the present invention.

FIG. 13 shows another form of solderable lead 230, not requiring a solder-retaining cradle, in which the solder slug 231 is held in position by a pair of tabs 233,235 in a manner similar to FIGS. 6 and 7.

It will be understood that any of the solderable lead configurations described may be used in conjunction with any of the solderable terminal clips described, or separately as reads for other elements, as indicated above.

In each of the terminals and leads described above, the solder slug, in the form of a short cylindrical bar or length of wire, is held in firm mechanical engagement with the body by one or more retaining tabs, in a position to be melted for the formation of a bond between the body or its fingers and a metallic surface such as a contact pad. It will be seen that the use of the retaining tab, such as 25 (FIG. 2), 76 (FIG. 3), 44 or 45 (FIG. 5), 183 (FIG. 6) avoids the need to wrap the terminal strip around a major part of the solder slug, in order to hold the solder slug securely. The solder slugs may have various cross-sections such as of square, round or other geometrical form, or be made from spherical pellets. Each terminal of the invention can be made by simple stamping and assembly steps, with minimal waste of material.

While the various tabs have been illustrated in the various forms of the invention as essentially rectangular, having a rectangular slot formed in the surface from which the tab is bent, it will be understood that other shapes of tab may be used, such as pointed or rounded or tapered or triangular, leaving corresponding openings in the terminal or lead surface.

It will be understood that other variations on the described forms of the invention will readily occur to those skilled in the art. The present invention is to be deemed defined and limited only by the appended claims.

What is claimed is:

1. A terminal clip adapted to be secured to a contact area on a substrate comprising:

an elongated body portion having a free end and a stem end, said body portion being cut to define a central spring finger between spaced portions of the body portion, said central finger being bent out of the plane of the body portion at approximately the point of attachment of said finger to the body portion, said central finger being cut to define a retaining tab, said retaining tab being bent out of the plane of said central finger at approximately the point of attachment of said tab to said central finger, said free end of said body portion beyond the point of attachment of said central finger being bent out of the plane of the body portion in the same direction as the central finger, said central finger and free end defining a gap to receive a substrate therein; and a discrete mass of solder in the bend formed between the body portion and the central finger, the retaining tab being indented into the mass of solder and holding said mass of solder in said bend, said bend being less than 180°, and on the side of said central finger nearer said stem end of said body portion.

2. A terminal clip according to claim 1 wherein said body portion is cut on lines extending from the tip of its free end to form two separate additional fingers defining one side of said gap.

3. A terminal clip according to claim 1, wherein said body free end is cut longitudinally along two lines to define a second retaining tab, said second tab being bent out of the plane of said free end at approximately its point of attachment to said free end, said terminal clip further comprising a second discrete mass of solder in the bend formed between said free end and said body portion, said second tab being indented into said second mass of solder and holding said second mass of solder in said bend, said bend being less than 180° and on the side of said additional finger nearer said central spring finger.

4. A terminal clip according to claim 1 wherein the cut in said body portion is substantially U-shaped with its ends directed toward the free end of the body portion and spaced therefrom, and wherein said free end constitutes an additional finger defining one side of said gap.

5. A terminal clip according to claim 4, wherein said additional finger is cut along lines to define a second retaining tab, said second tab being bent out the plane of said additional finger at approximately its point of attachment to said additional finger, said terminal clip further comprising a second discrete mass of solder in the bend formed between the additional finger and the body portion, the second tab being indented into the second mass of solder and holding said second mass of solder in said latter bend, said bend being less than 180° and on the side of said additional finger nearer said central spring finger.

6. A terminal clip adapted to be secured to a contact pad on a substrate comprising:

a body portion having a stem end and a free end, said body portion being bent rearwardly more than 90° out of the plane of said stem end to form a lower contact surface, said body portion being bent upwardly through an angle less than 180° at a point nearer the free end, the inside of said bend constituting a first cradle, said body portion further being bent forwardly through an angle less than 180° at a point still nearer said free end of the body portion, said bend constituting a second cradle, said free end constituting an upper contact surface, said upper and lower contact surfaces defining a gap to receive said substrate, said body portion being cut longitudinally along two lines and laterally connecting the longitudinal cuts to define a retaining tab, said retaining tab being bent out of the plane of the body portion at approximately the point of attachment of said tab to said body portion in the direction of said gap; and a discrete mass of solder in the first cradle, the retaining tab being indented into said mass of solder and holding said mass of solder in said first cradle.

7. A terminal clip according to claim 6 wherein said retaining tab is between said first and second cradles, said body portion between said first and second cradles having a second pair of longitudinal cuts therein defining a second retaining tab, said second tab being bent out of the plane of said body portion in the direction of said gap, said terminal clip further comprising a second discrete mass of solder in said second cradle, said second tab being indented into the second mass of solder and holding it in said second cradle.

8. A terminal clip according to claims 1 or 6 further comprising:

a stem portion integrally connected to said stem end of said body portion, said stem portion having a flat mounting surface portion, said mounting surface portion being bent out of the plane of said stem portion at an angle greater than 90° but less than 180°, the inside of said bend constituting a stem cradle, the mounting surface portion being cut along lines to define a stem portion retaining tab, said stem portion retaining tab being bent out of the plane of said flat mounting surface portion in the direction of said stem cradle, leaving an opening through said flat mounting surface portion; and an additional discrete mass of solder in said cradle, the stem portion retaining tab being indented into said additional mass of solder and holding said additional mass of solder in said stem cradle.

9. A solderable lead for connecting an electrically conductive element to a substrate or the like comprising:

a connector portion adapted for engagement with said conductive element;

a stem portion integrally connected to said connector portion, said stem portion having a flat mounting surface portion, said mounting surface portion being bent from the remainder of said stem portion to form the inside of said bend into a cradle, a discrete solder mass in said cradle, a retaining tab struck out from said mounting surface portion and bent out of the plane of said flat mounting surface portion in the direction of said cradle, and forming an opening through said flat mounting surface portion adapted to permit flow of molten solder therethrough;

said retaining tab being in contact with said solder mass and holding said solder mass in said cradle.

10. A lead as in clip 9 wherein said connector portion is a terminal clip, said terminal clip comprising:

an elongated body portion having a free end and a stem end, said body portion being cut to define a central spring finger between spaced portions of the body portion, said central finger being bent out of the plane of the body portion at approximately the point of attachment of said finger to the body portion, said central finger being cut to define a retaining tab, said retaining tab being bent out of the plane of said central finger at approximately the point of attachment of said tab to said finger, said free end of said body portion beyond the point of attachment of said central finger being bent out of the plane of the body portion in the same direction as the central finger, said central finger and free end defining a cap to receive a substrate therein; and a discrete mass of solder in the band formed between the body portion and the central finger, the retaining tab being indented into the mass of solder and holding said mass of solder in said bend, said bend being less than 180 degrees, and on the side of said central finger mearer said stem end of said body portion.

11. A lead as in claim 9 wherein said connector portion is a terminal clip, said termainal clip comprising:

a body portion having stem end and a free end, said body portion being bent rearwardly more than 90 degrees out of the plane of said stem end to form a lower contact surface, said body portion being bent upwardly thorugh an angle less than 180 degrees at a point nearer the free end, the inside of said bend constituting a first cradle, said body portion further being bent forwardly through an angle less than 180 degrees at point still nearer said free end of the body portion, said bend constituting a second cradle, said free end constituting an upper contact surface, said upper and lower contact surface defining a gap to receive a substrate, said body portion being cut longitudinally along two lines and laterally connecting the longitudinal cuts to define a retaining tab, said retaining tab being bent out of the plane of the body portion at approximately the point of attachment of said tab to said body portion in the direction of said gap; and a discrete mass of solder in the first cradle, the retaining tab being indented into said mass of solder and holding said mass of solder in said first cradle.

12. A lead as in claim 9 wherein said connector portion forms a spring contact for an electrical connector.

13. A lead as in claim 9 wherein said connector portion is a terminal clip adapted to be coupled to a semiconductor chip holder.

14. A solderable lead for connecting an electrically conductive element to a substrate or the like comprising:

a connector portion adapted for engagement with said conductive element;

a stem portion integral with said connector portion, a discrete solder mass juxtaposed to said stem portion adjacent the end thereof, said stem portion having at least one integral tab bent outwardly therefrom and retaining said solder mass against said stem portion, said tab leaving an opening in said stem portion for flow of solder from said mass when heated to the melting point.

15. A solderable lead as in claim 14 having two opposed integral tabs extending therefrom and retaining said solder mass, said tabs leaving an opening in said stem portion for flow of solder of said mass when heated to the melting point.

16. A terminal clip adapted to be secured to a contact area on a substrate comprising:

an elongatd body portion having a free end and a stem end, said body portion having a spring finger formed therein, said finger being bent out of the plane of the body portion at approximately the point of attachment of said finger to the body portion, said finger having a retaining tab formed therein, said retaining tab being bent out of the plane of said finger at apprximately the point of attachment of said tab to said finger, said free end of said body portion beyond the point of attachment of said finger being bent out of the plane of the body portion in the same direction as the finger, said finger and free end defining a gap to receive a substrate therein; and a discrete mass of solder held between said finger and said retaining tab, said tab being indented into the mass of solder and holding said mass of solder to said finger.

17. A teminal clip according to claim 16, further comprising:

a second retaining tab formed therein, each of said retaining tab being bent out of the plane of said finger at approximately the point of attachment of each said tab to said finger, said mass of solder being held between both retaining tabs and said finger, both tabs being indented into the mass of solder.

18. A termianl clip adapted to be secured to a contact pad on a substrate comprising:

a body portion having a stem end and a free end, said body portion being bent rearwardly mor than 90 degrees out of the plane of said stem end to form a lower contact surface, said body portion being bent upwardly through an angle less than 180 degrees at a point nearer the free end, the inside of said bend constituting a first cradle, said body portion further being bent forwardly through an angle less than 180 degrees at a point still nearer said free end of the body portion, said bend constituting a second cradle, said free end constituting an upper contact surface, said upper and lower contact surfaces defining a gap to receive a substrate, said body portion being having a retaining tab formed therein, said retaining tab being bent out of the plane of the body portion at aporoximately the point of attachment of said tab to said body portion in the direction of said gap; and a discrete mass of solder in the first cradle, the retaining tab being indented into said mass of solder and holding said mass of solder in said first cradle.

* * * * *